United States Patent
Verhaverbeke et al.

(10) Patent No.: US 7,163,018 B2
(45) Date of Patent: Jan. 16, 2007

(54) SINGLE WAFER CLEANING METHOD TO REDUCE PARTICLE DEFECTS ON A WAFER SURFACE

(75) Inventors: Steven Verhaverbeke, San Francisco, CA (US); Christopher Laurent Beaudry, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 94 days.

(21) Appl. No.: 10/736,007

(22) Filed: Dec. 15, 2003

(65) Prior Publication Data

US 2004/0127044 A1 Jul. 1, 2004

Related U.S. Application Data

(60) Provisional application No. 60/434,188, filed on Dec. 16, 2002.

(51) Int. Cl.
B08B 6/00 (2006.01)
C25F 1/00 (2006.01)
C25F 3/30 (2006.01)
C25F 5/00 (2006.01)
(52) U.S. Cl. ...................... 134/1.3; 438/745
(58) Field of Classification Search .......... 134/1.1–1.3; 438/745–754
See application file for complete search history.

(56) References Cited

U.S. PATENT DOCUMENTS

| 5,466,389 A * | 11/1995 | Ilardi et al. ............ 510/175 |
|---|---|---|
| 5,853,491 A * | 12/1998 | Schulz .......................... 134/2 |
| 6,468,362 B1 * | 10/2002 | Chen et al. .................. 134/26 |
| 2003/0051742 A1* | 3/2003 | Boyers ......................... 134/30 |
| 2004/0029388 A1* | 2/2004 | Verhaverbeke et al. ..... 438/689 |
| 2004/0029395 A1* | 2/2004 | Zhang et al. ............... 438/748 |
| 2004/0221877 A1* | 11/2004 | Bergman ..................... 134/34 |

OTHER PUBLICATIONS

Iler, Ralph K., The Colloid Chemistry Of Silica And Silicates, © 1955 By Cornell University, Cornell University Press, London: Geoffrey Cumberlege, Oxford University Press, First published 1955, Printed in the United States Of America By The George Banta Publishing Company, Menasha, Wisconsin, pp. 44-48.

* cited by examiner

Primary Examiner—Duy-Vu N Deo
(74) Attorney, Agent, or Firm—Blakely Sokoloff Taylor & Zafman

(57) ABSTRACT

Methods of preventing air-liquid interfaces on the surface of a wafer in order to prevent the formation of particle defects on a wafer are presented. The air-liquid interfaces may be prevented by covering the entire surface of the wafer with liquid at all times during a cleaning process while the surface of the wafer is hydrophobic. Methods of preventing the formation of silica agglomerates in a liquid during a pH transition from an alkaline pH to a neutral pH are also presented, including minimizing the turbulence in the liquid solution and reducing the temperature of the liquid solution during the transition.

31 Claims, 6 Drawing Sheets

TOP VIEW OF WAFER

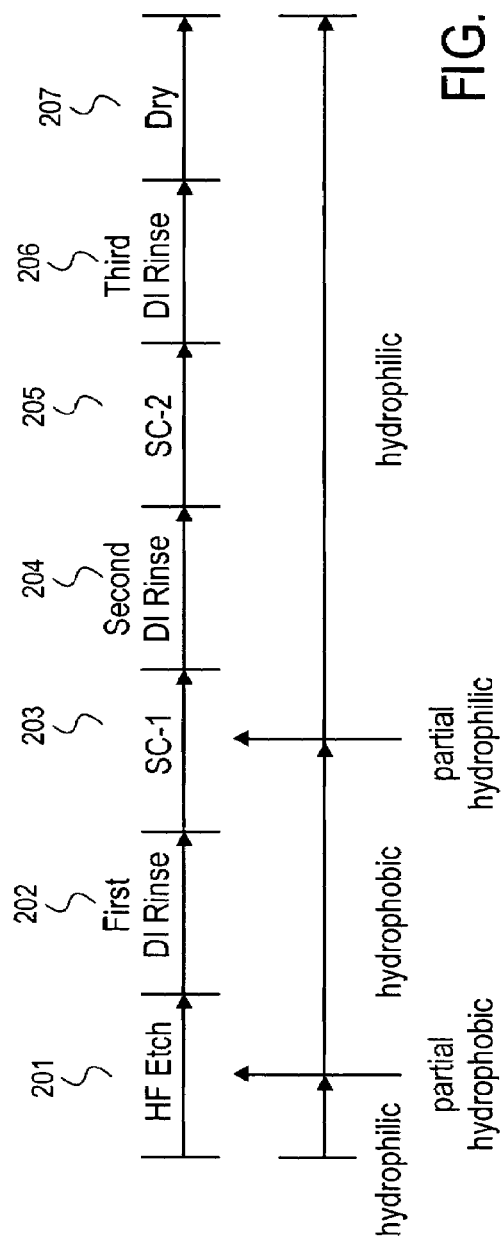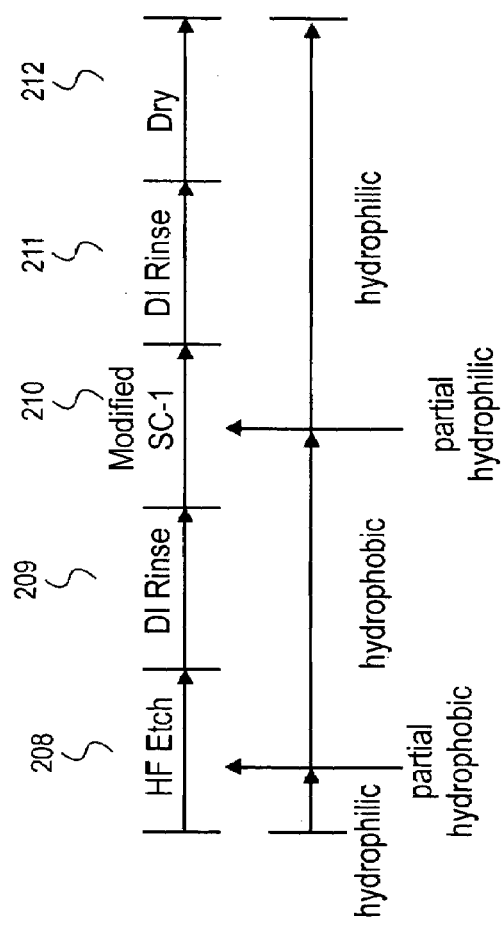

SINGLE WAFER CLEANING METHOD TO REDUCE PARTICLE DEFECTS ON A WAFER SURFACE

This non-provisional patent application claims priority to the provisional patent application Ser. No. 60/434,188, filed Dec. 16, 2002.

BACKGROUND OF THE INVENTION

1. Field of the Invention

The present invention relates generally to the field of front-end-of-the-line wet cleaning of a semiconductor wafer.

2. Discussion of Related Art

In semiconductor manufacturing, wet cleaning comprises a majority of the steps required to make a device. For many years, immersion cleaning has been the method of choice for wet cleaning. Due to the increasingly stringent requirements of wafer surface cleanliness, the limitations of such immersion cleaning are now being challenged.

In immersion cleaning, a batch of wafers may be dipped into a series of chemical and rinsing baths. Traditionally, the chemistry cleaning solutions are based on the RCA cleaning method: $NH_4OH/H_2O_2/H_2O$ (or Standard Clean 1, SC-1) followed by $HCl/H_2O_2/H_2O$ (or Standard Clean 2, SC-2). SC-1 is most effective for cleaning particulate and organic contamination while SC-2 is very efficient for cleaning metallic contamination. In some cases HF precedes the sequence in order to etch or remove the oxide. The effectiveness of wet chemical cleaning is a function of the cleanliness of the overall cleaning system, which is in turn a function of the cleanliness of its sub-components, such as the carriers holding the wafers, the cleaning baths, and the transport environment.

A limitation of immersion cleaning is the build up of contamination during the useful life of the chemical bath by the particles removed from the wafers being cleaned. Inherently, immersion cleaning invites cross contamination between wafers as well as contamination of the chemical bath itself. The development and use of ultrapure materials, chemicals, and de-ionized (DI) water have allowed the extension of immersion cleaning methodology into many manufacturing lines. However, even using fresh chemicals for every batch, in addition to being very expensive, would not completely eliminate the issue of cross-contamination.

Consequently, single-wafer cleaning has become an alternative to batch cleaning. However, even single-wafer cleaning faces challenges. In a single-wafer spin cleaner, single wafers are cleaned in a horizontal orientation. Particles on the wafer are removed, in part, by applying cleaning chemicals and rinses to the surfaces of the wafer. However, during cleaning and rinsing, etched species or particulates tend to collide with the wafer surface causing particle defects. Hence, keeping the particles off the wafer surface is a challenge.

SUMMARY OF THE INVENTION

A single wafer cleaning method is described to reduce particle defects on the wafer surface. According to one embodiment of the invention, the method includes minimizing the number of surface defects on a wafer by minimizing the number of air-liquid interfaces that the wafer may experience during a single-wafer wet cleaning process. This is especially important for wafers with a hydrophobic surface. Additionally, according to another embodiment of the invention, the method includes reducing or eliminating particle defects deposited on the wafer surface by minimizing reactions between the etch species and the wafer in a cleaning solution during a pH transition.

Other features, according to other embodiments of the present invention, will be apparent from the accompanying drawings and from the detailed description that follows.

BRIEF DESCRIPTION OF THE DRAWINGS

FIG. 2a is an illustration of an RCA cleaning sequence.

FIG. 2b is an illustration of a cleaning sequence incorporating a modified cleaning solution.

DETAILED DESCRIPTION OF THE PRESENT INVENTION

Described herein is a single wafer cleaning method. In the following description numerous specific details are set forth. One of ordinary skill in the art, however, will appreciate that these specific details are not necessary to practice embodiments of the invention. While certain exemplary embodiments of the invention are described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

Particles may stick to the surface of a wafer during a clean in a horizontal spinning single wafer cleaning apparatus under different conditions. One set of conditions where particles may stick to the surface of the wafer is when air-liquid interfaces exist on the surface of the wafer. Air-liquid interfaces are of particular concern when the surface of the wafer is hydrophobic. Another set of conditions is the transition from an alkaline solution to a neutral or acidic solution. The pH transition may promote the formation of silica agglomerates within the solution and the deposition of the agglomerates on the wafer surface.

Figure 1A:
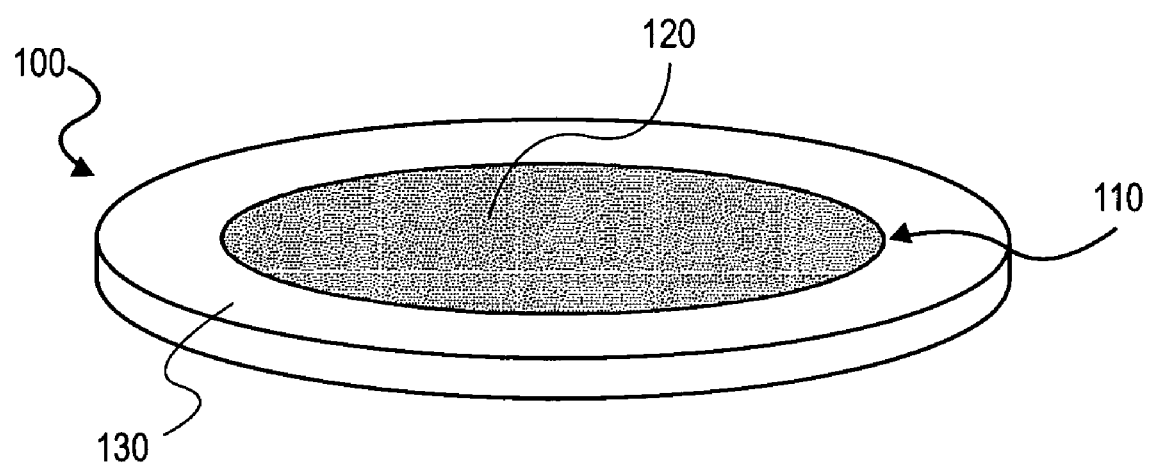
FIG. 1a is an illustration of a cross-sectional view of a wafer onto which a liquid has been dispensed.
Figure 1B:
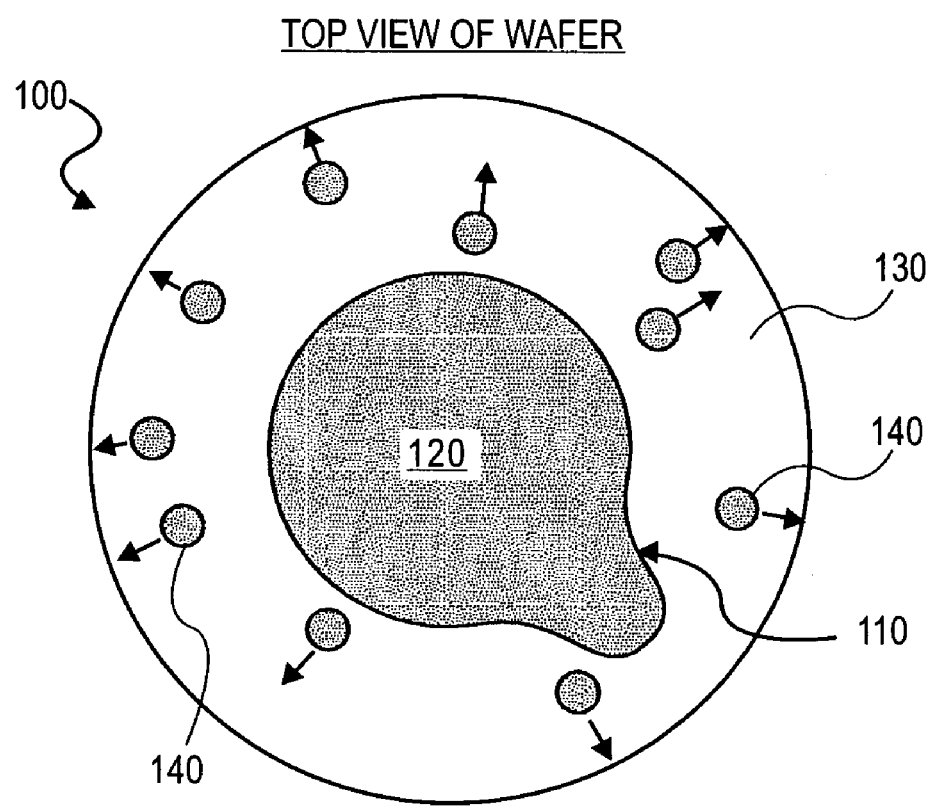
FIG. 1b is an illustration of an overhead view of a wafer onto which a liquid has been dispensed.

Particle defects on a wafer 100 may occur due to air-liquid interfaces 110 between a liquid solution 120 on the surface 130 of the wafer 100, as illustrated in FIG. 1a. At an air-surface interface 110, particles from the liquid solution 120 may deposit onto the surface 130 of the wafer 100. This is particularly true when the wafer 100 has a hydrophobic silicon surface 130. A surface is hydrophobic when it is repellant to water. Particle defects are of particular concern when the wafer surface 130 is hydrophobic because solid particles are very strongly attracted to a hydrophobic wafer surface 130 and may attach to the wafer surface 130. Streaking defects and an increase in the number of air-liquid interfaces on the wafer may result when a liquid, and in particular an aqueous solution, is placed onto a hydrophobic surface because the liquid may "bead" and form droplets 140 that may roll off of the wafer 100, as illustrated in FIG 1b, due to the centrifugal force created by the spinning of the wafer in a horizontal spinning single wafer cleaning apparatus described below. The beading of the liquid is a particular problem when the surface of the wafer is not completely coated with a liquid because the liquid may slide around on the hydrophobic surface, or roll off of the hydrophobic surface, resulting in an uneven liquid coverage and clean.

A silicon wafer surface 130 may become hydrophobic during a step that etches away an oxide layer on a silicon wafer surface 130 and may remain hydrophobic until the wafer surface 130 is oxidized and becomes hydrophilic. For example, in the RCA front end of the line cleaning process illustrated in FIG. 2a, the wafer 100 may become partially hydrophobic during the HF etch 201 and remain hydrophobic throughout the first de-ionized (DI) water rinse 202, and into the SC-1 clean 203 where the surface of the wafer 100 may become hydrophilic due to the oxidation of the wafer surface 130 by the SC-1 solution. The SC-1 solution contains ammonium hydroxide ($NH_4OH$), hydrogen peroxide ($H_2O_2$), and water ($H_2O$). The wafer surface 130 may remain hydrophilic throughout the cleaning process through the second DI water rinse 204, the SC-2 clean 205, the third DI water rinse 206, and the dry 207. The SC-2 clean contains hydrochloric acid (HCl), hydrogen peroxide ($H_2O_2$), and water ($H_2O$). In an alternate embodiment illustrated in FIG. 2b, the front end of the line cleaning process may include the use of a modified SC-1 solution that replaces the SC-1 clean 203, the second rinse 204, and the SC-2 clean 205 of the RCA clean. The modified SC-1 cleaning solution may contain ammonium hydroxide ($NH_4OH$), hydrogen peroxide ($H_2O_2$), water ($H_2O$), a chelating agent to bind metal ion impurities, and optionally a surfactant to reduce the surface tension of the wafer. The mixing ratios of $NH_4OH/H_2O_2/H_2O$ in the modified SC-1 solution may be between 5/1/1 and 1000/1/1. In one particular embodiment, the modified SC-1 solution may be formulated by mixing Mitsubishi Chemical's AM-1 solution containing ammonium hydroxide, a chelating agent, and a surfactant with hydrogen peroxide and water. The mixing ratio of $AM-1/H_2O_2/H_2O$ in this embodiment may be approximately 1/2/80. In the modified SC-1 process illustrated in FIG. 2b, the wafer may become partially hydrophobic during the HF etch 208 and remain hydrophobic throughout the first DI water rinse 209 until the modified SC-1 clean 210 that may oxidize the wafer surface 130 and make the wafer surface 130 hydrophilic. These front end of the line cleaning processes are introduced as examples of how the wafer surface 130 may be effected by the different solutions applied to a wafer 100 and are not meant to be limiting.

In an embodiment, the air-liquid interfaces 110 on a wafer surface 130 may be minimized by covering the wafer surface 130 with liquid at all times during a cleaning process sequence in a horizontal spinning single wafer cleaning apparatus. In an alternate embodiment, the wafer surface 130 may be covered with liquid during the times when the wafer surface is partially or entirely hydrophobic, such as in the cleaning process illustrated in FIG. 2b during the HF etch 208, the first DI water rinse 209, and during the modified SC-1 clean 210. A method according to one embodiment includes dispensing a liquid solution onto a horizontally positioned wafer in a single-wafer cleaning chamber 300 illustrated in FIG. 3 at a flow rate sufficient to cover the hydrophobic surface with the liquid while maintaining a wafer spin rate sufficient to cover the hydrophobic surface with the liquid.

Figure 3:
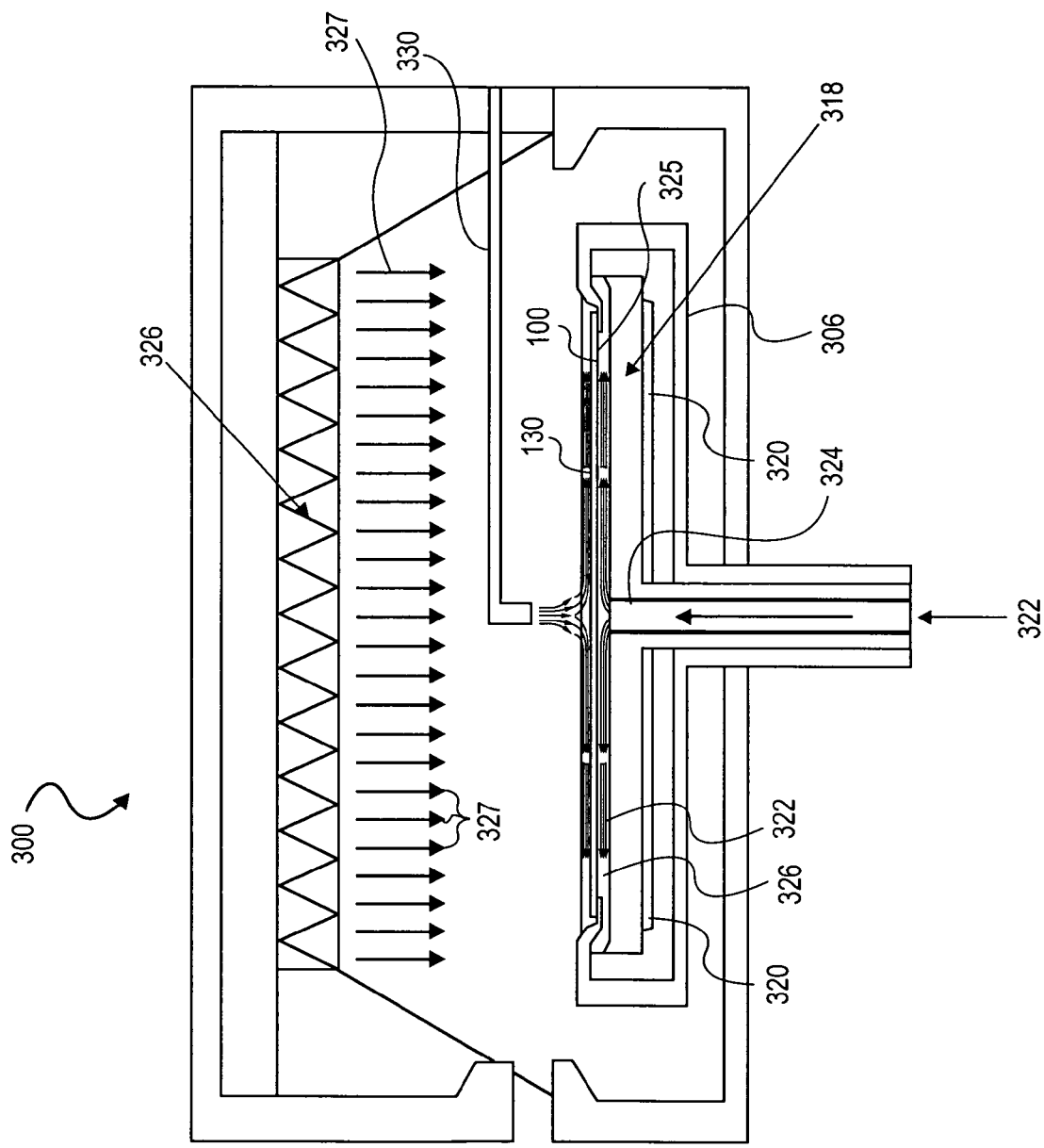
FIG. 3 is an illustration of a cross-sectional view of a horizontal spinning single wafer cleaning apparatus.

FIG. 3 is an illustration of one embodiment of a horizontal spinning single wafer cleaning apparatus 300. As shown in FIG. 3, the single wafer cleaning chamber 300 may contain a wafer holding bracket 306. Once the wafer 100 is placed onto the bracket 306, the bracket 306 may be lowered to a process position as illustrated. This process position may place the wafer 100 a short distance above a circular plate 318. The circular plate 318 can contain transducers 320 that are capable of emitting sound in the megasonic frequency range. A fluid feed port 324 can be added to the transducer plate 318 to fill an approximate 3 millimeter (mm) gap 326 between the transducer plate 318 and the bottom side of the wafer 100 with a liquid 322 at various times during wafer 100 processing. The liquid 322 can act as a carrier for transferring megasonic energy onto a wafer bottom surface 325 or as a way to heat the wafer if the liquid 322 is hot. The top of the single wafer cleaning chamber 300 can contain a filter 326 to clean air 327 that is flowing into the process chamber 300 and onto a top wafer surface 130. At least one nozzle 330 can be positioned to direct flow of a gas, vapor, or a liquid onto the top wafer surface 130. In one embodiment of the invention, the nozzle 330 may dispense a liquid solution to contact the top wafer surface 130 of the wafer 100. The entire wafer surface 130 may be covered with a liquid solution by dispensing a liquid solution onto a horizontally positioned wafer 100 in a single-wafer cleaning chamber 300 at a flow rate sufficient to cover the hydrophobic wafer surface 130 with the liquid while maintaining a wafer spin rate sufficient to cover the hydrophobic wafer surface 130 with the liquid. The wafer may have any diameter, but may, for example, have a 300 mm diameter or a 450 mm diameter. The liquid may be any of the solutions described in relation to the front end of the line cleaning processes described in FIGS. 2a and 2b in addition to other liquids used on a silicon wafer 100 such as tetramethylammonium hydroxide (TMAH) or hydrochloric acid (HCl).

Figure 4:
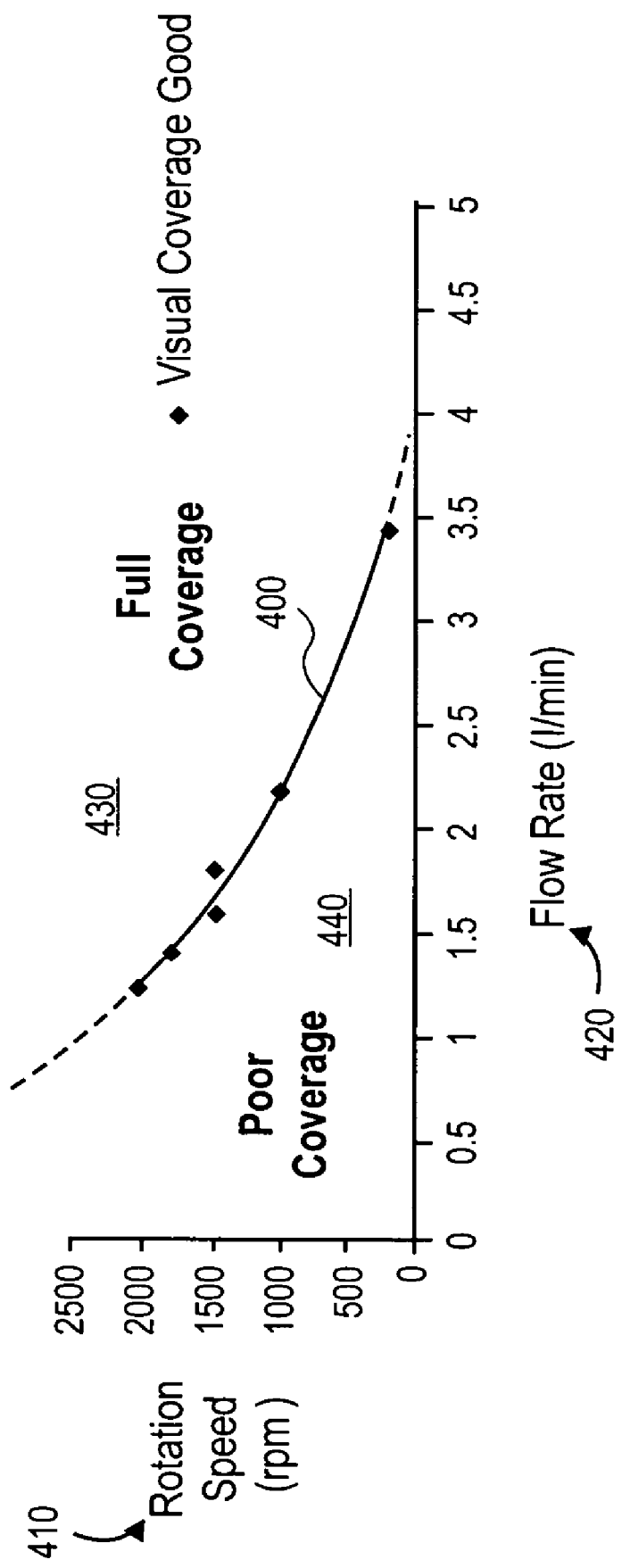
FIG. 4 is an illustration of a graph plotting the liquid coverage of a single wafer in a horizontal spinning single wafer cleaning apparatus.

An example of the relationship between the wafer-rotation speed and the flow rate to cover a 300 mm wafer 100 with a liquid 120 is illustrated in the graph of FIG. 4. A combination of rotation speed in revolutions per minute (rpm) 410 of the wafer 100 and the flow rate in liters per minute (l/min) 420 of the liquid 120 dispensed onto the wafer 100 from the area 430 above the curve 400 may result in full coverage of a wafer surface 130 when a single dispense nozzle 330 centered, or nearly centered, over the top wafer surface 130 is used. The nozzle may be off center in the approximate range of 2 mm–15 mm, and more particularly in the approximate range of 5 mm–10 mm. Therefore, for each flow rate 420 there is a range of rotation speeds 440 above the curve 400 that may result in full coverage of the wafer surface 130. For example, for a flow rate 420 of 1.5 l/min any rotation speed above approximately 1500 rpm may result in the full coverage of the wafer 100 with a liquid 120. In an embodiment, the flow rate from a single dispense positioned approximately over the center of the wafer may be in the approximate range of 0.5 l/min and 2.0 l/min and the rotation speed 410 of a 300 mm wafer 100 may be at least 1000 rpm, or more particularly in the approximate range of 1500 rpm and 3000 rpm. In one particular embodiment, the rotation speed 410 may be approximately 2250 rpm and the flow rate 420 may be approximately 1.5 l/min. The number of particle defects on a wafer may be reduced to less than 10 defects by using the above method.

The rotation speed (rpm) 410 and flow rate (l/min) 420 combinations from the area below the curve 400 may result in coverage of an area less than that of the 300 mm wafer 100 such that the outer edge of the wafer 100 appears "dry", as illustrated in FIG. 1a, and results in high defect counts in this dry area. However, in an embodiment, it may be possible to achieve full coverage of the wafer 100 using the rotation speed (rpm) 410 and the flow rate (l/min) 420 combinations from the area below the curve 440 with a sweeping dispense of the single dispense line 330 toward the edge of the wafer along with decreasing the rotation speed of the substrate. The sweeping motion may or may not occur simultaneously with a decrease in rotation rate. The decrease in the rotation rate may occur before or after the sweeping motion of the single dispense line 330.

Also, the liquid cover may be maintained throughout the transitions between different steps in a cleaning process, such as the front of the line cleaning processes illustrated in FIGS. 2a and 2b, by overlapping the cleaning steps. For example, in the process described in FIG. 2b, the dispensation of the water for the first DI rinse may begin while the HF etch solution 208 is still being dispensed onto the wafer 100. The dispensing of the HF etch solution 208 may then be stopped while the first DI rinse 209 flows onto the wafer. While the first DI rinse 209 is still dispensing onto the wafer, the dispense of the modified SC-1 solution 210 may begin. The dispense for the first DI rinse 209 may then cease so that the modified SC-1 solution may clean the wafer surface. Then, while the SC-1 solution 210 is being dispensed, the second DI rinse 211 may begin to be dispensed. The SC-1 solution 210 may then cease being dispensed and the second DI rinse 211 may proceed. The dispense of the second DI rinse 211 may then stop in order to dry the wafer at 212. During each of the liquid to liquid transitions, the combination of the two liquid solutions may be dispensed at a combined flow rate that may be sufficient to maintain continuous full coverage of the substrate surface with a liquid layer according to the graph of FIG. 4. The liquid steps may overlap with one another within the approximate range of 0.5 seconds –5 seconds and more particularly within the approximate range of 1 seconds –2 seconds. In this way, the air-liquid interfaces on the surface of the wafer may be minimized during the transitions between different cleaning steps where the surface of the wafer is hydrophobic.

The coverage of the wafer surface by the liquid may also be improved by adding a surfactant to any liquid solution applied to the wafer while it is hydrophobic to reduce the surface tension of the liquid so that the liquid may not bead as much on a hydrophobic surface. Surfactants are typically long hydrocarbon chains containing a hydrophilic group and a hydrophobic group. The surfactants may be nonionic, anionic, cationic, or a mixture of surfactants. Surfactants that may be used include, for example, polyoxyethylene butylphenyl ether and polyoxyethylene alkylphenyl sulfate. The surfactant may be present in the modified SC-1 liquid cleaning solution in the approximate range of 5 ppm to 1100 ppm. In one particular embodiment the surfactant may be approximately 0.05% concentration by volume in the liquid cleaning solution. The surface tension reducing agent may be added to the cleaning solution prior to dispensing the solution onto the wafer from nozzle 330 or after dispensing the solution onto the wafer top surface 130 from a secondary nozzle (not shown).

Figure 5:
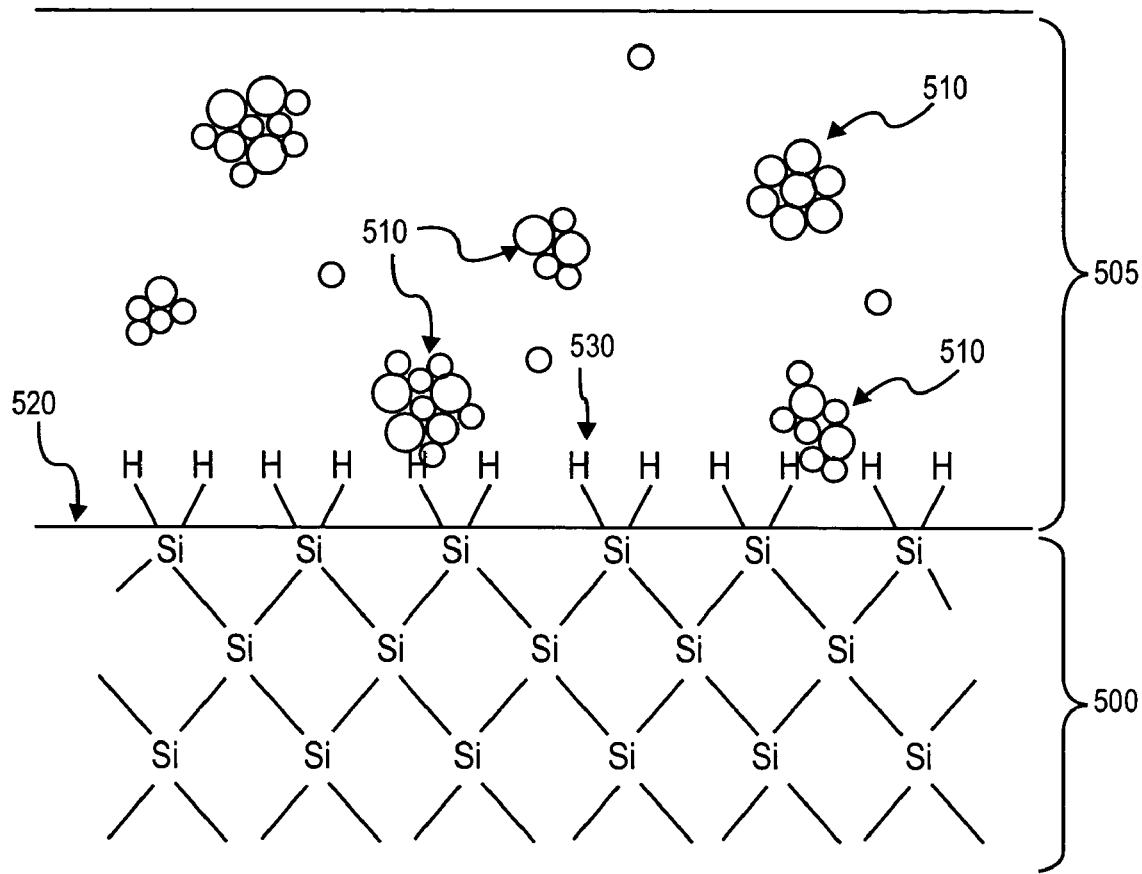
FIG. 5 is an illustration of silica agglomerate particles in a liquid solution above a surface of a silicon wafer.

Particle defects may also occur due to the deposition of particles from a liquid solution onto a surface of a wafer. Particles may become part of a liquid solution during an alkaline cleaning step. Solutions optimized for particle cleaning are often an alkaline mixture (pH between around 9–10) such as a standard clean (SC-1) solution of $NH_4OH$ and $H_2O_2$ diluted with de-ionized (DI) water, or a modified SC-1 that may contain $NH_4OH$, $H_2O_2$, de-ionized (DI) water, a chelating agent, and a surfactant. The particle removal mechanism for alkaline based cleaning solutions, such as SC-1 and modified SC-1, is based on a simultaneous "etch and lift" phenomena by oxidizing the silicon surface with $H_2O_2$ and then slightly etching with $NH_4OH$, thus undercutting any particles on the wafer surface. Acoustic energy is often used to enhance the particle removal efficiency. In addition to the particles removed from the substrate, the etching action of oxidized silicon surface results in silica (SiOH) dissolved in the solution. The alkaline solution has a high pH, approximately 9~10, so that the particles in solution and the substrate surface are typically negatively charged, providing a mutually repulsive electrostatic force that keeps particles in solution and thus preventing particle re-deposition. This is true for most common metal oxides in aqueous solutions. As long as the pH of the solution covering the wafer surface is high, the silicate species remain soluble in solution due to the electrostatic repulsion from the substrate surface as described above. However, typically following an alkaline SC-1 based chemical step (pH ~9–10) the substrates are rinsed with DI water (pH=7) or even an acidified rinse (pH<7). Thus, the wafer surface may be exposed to a transition from alkaline or high pH solution of pH ~9–10 to a lower pH rinse solution of around pH 7. During the pH transition from a high pH of solution to a low pH solution, the electrostatic charge is reduced, therefore decreasing the repulsion force between the species themselves and the wafer surface and may cause agglomeration of the silica, which may deposit on the wafer surface. FIG. 5 illustrates silica agglomerates 510 in solution above a silicon wafer 500 having a hydrophobic silicon surface 520 terminated by hydrogen 530. The silica agglomerates 510 may be strongly attracted to the hydrophobic silicon surface 520 by Van der Walls forces and result in silica agglomerates 510 sticking to the hydrophobic silicon surface 520 and causing surface defects. This is a classic dehydration or condensation reaction exemplified as follows:

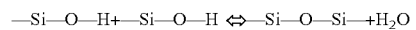

$$—Si—O—H + —Si—O—H \Leftrightarrow —Si—O—Si— + H_2O$$

To avoid pH transient defects, it may be valuable to set up the processing conditions to reduce the tendency for condensation reactions to occur as well as to reduce the tendency of any agglomerates 510 or other dissolved species from coming too close in proximity to the wafer surface 520. In other words, reducing particle defects on the wafer may be accomplished by minimizing reactions, or tendency of reactions, between the etch-products and the wafer in a cleaning solution during a pH transition.

Turbulence in the liquid layer from high flow rates, angle of dispensation, dispensation location, type of dispensation (spray, single stream, knife edge, etc.), or high wafer spin rates may collapse the liquid onto the wafer the condensation reaction that leads to aggregate formation or deposition of aggregates onto the wafer. Thus, it is important to minimize the turbulence of the liquid on the wafer and to keep any etch species or their agglomeration as far from the surface as possible. The proximity of the agglomerated silicate to the substrate is dependent on the cleaning system. In a horizontal spinning single wafer cleaning apparatus, the thickness of the liquid on the top of the wafer may be less than a few millimeters and often is less when spinning the wafer at high speeds. Reducing the boundary layer by increasing the rotation speed may result in silicate deposition.

In an embodiment, the agglomeration of silica during the transition from an alkaline solution to a neutral solution or an acidic solution may be reduced by slowly changing the spin rate of the wafer and by maintaining the spin rate at a low speed to minimize the amount of turbulence created in the liquid on the surface of the wafer while maintaining a thickness of the liquid on the wafer sufficient to prevent the deposition of particles onto the surface of the wafer. In one embodiment the spin rate of the wafer may be in the approximate range of 1 rpm and 500 rpm, and more particularly in the approximate range of 1 rpm and 200 rpm. In one particular embodiment the spin rate during the transition is no higher than approximately 50 rpm. In an embodiment, the spin rate may be changed at a rate of less than 100 rpm/s, and more particularly in the approximate range of 1 rpm/s and 50 rpm/s. In one particular embodiment the spin rate may be changed at a rate of approximately 5 rpm/s. In one embodiment the thickness of the liquid on the wafer may be in the approximate range of 0.5 mm and 3.0 mm, and more particularly approximately 1.0 mm.

The deposition of agglomerates onto the wafer surface 130 may be further decreased by minimizing the air to liquid interfaces on the wafer surface 130. Minimizing air to liquid interfaces on the wafer surface 130 may be accomplished in one embodiment by covering the entire surface of the wafer with liquid during the pH transition. The entire wafer surface 130 may be covered with a liquid solution 120 by dispensing a liquid solution 120 onto a horizontally positioned wafer 100 in a single-wafer cleaning chamber 300 at a flow rate sufficient to cover the hydrophobic wafer surface 130 with the liquid while maintaining a wafer spin rate sufficient to cover the hydrophobic wafer surface 130 with the liquid. In an alternate embodiment the air to liquid interfaces on the wafer surface may be minimized by maintaining the liquid cover throughout the transition between the alkaline cleaning solution and the neutral or acidic solution.

According to another embodiment of the invention, lowering the temperature of the system may reduce the tendency of the condensation reactions that cause the agglomeration of silica. Typically, an alkaline solution such as SC-1 or modified SC-1 is heated in the approximate range of 50° C. to 80° C. where it is very effective for particle removal. Therefore, agglomeration may be countered by reducing the temperature of the alkaline solution towards the end of the heated alkaline solution process step to within the range of approximately 10° C. and 50° C., and more particularly approximately 40° C. In one embodiment this may be accomplished by mixing a cooler alkaline solution with the heated alkaline solution, either on the wafer or in the line prior to dispensation. This embodiment may lower the temperature of the alkaline cleaning solution in contact with the wafer surface yet maintain the high pH. Therefore, during a pH transition from the high pH and low temperature alkaline solution to a low-temperature low pH de-ionized water (DI) rinse, the tendency of agglomeration and deposition of agglomerates on the wafer surface may be reduced. In an alternate embodiment, the heated alkaline solution may be cooled by mixing the alkaline solution with a cooler rinse such as de-ionized (DI) water solution near the end of the alkaline solution process step, either directly on the substrate or in line before dispensation.

Figure 6:
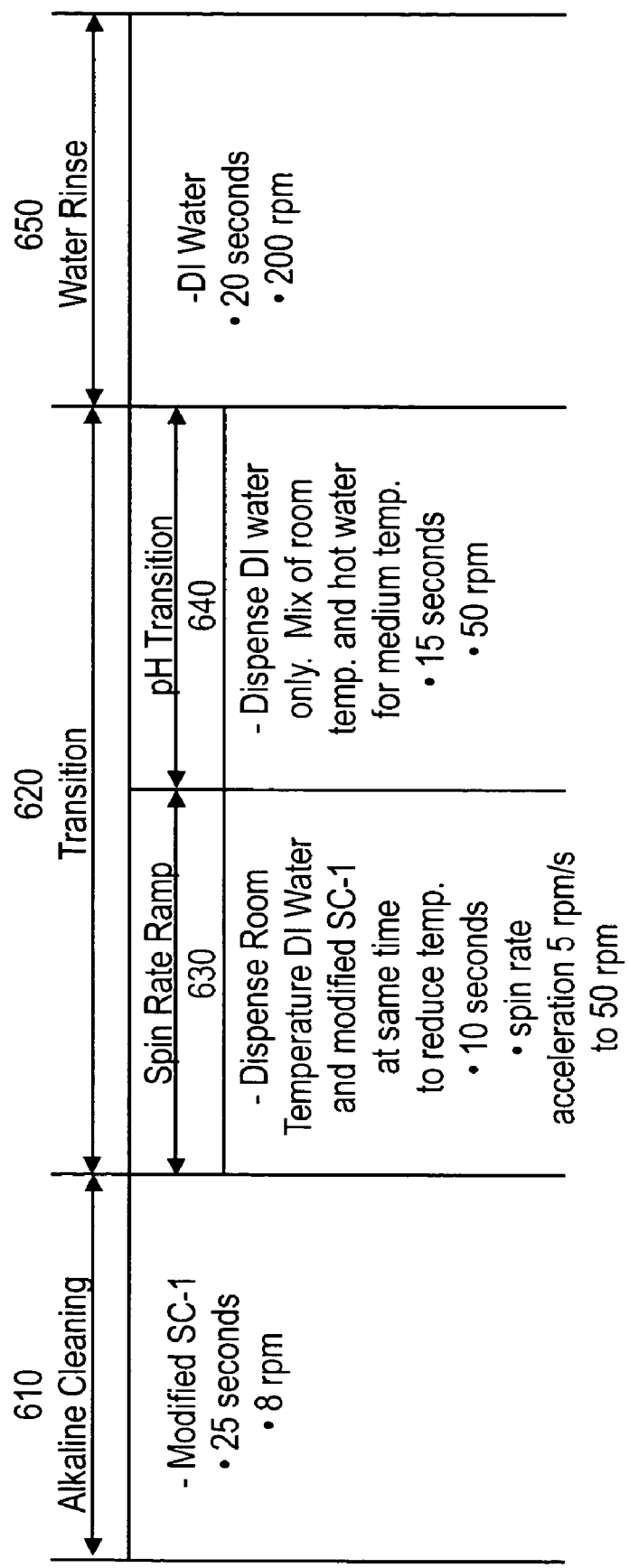
FIG. 6 is an illustration of a cleaning sequence including the parameters for a transition from an alkaline cleaning solution to a neutral rinse.

In yet another embodiment, the heated alkaline solution may be cooled during a transition from high pH to low pH by two steps combining low wafer rotation speed and acceleration with a decrease in the temperature of the heated alkaline solution. In one particular embodiment illustrated in FIG. 6, the transition may occur in two steps. The alkaline cleaning step 610 may be performed using a modified SC-1 solution that is applied to the wafer in a single wafer horizontal spinning cleaning tool for approximately 25 seconds at a flow rate of approximately 4.0 l/min while the wafer is spinning at approximately 8 rpm. This combination of spin rate and flow rate may cover the entire topside of the wafer with the modified SC-1 solution during step 610. During the transition period 620 that lasts for approximately 25 seconds, there are two different steps, the spin rate ramping step 630 and the pH transition step 640. In the spin rate ramping step 630, which lasts for approximately 10 seconds, the spin rate of the wafer may be increased from approximately 8 rpm to approximately 50 rpm at approximately 5 rpm/sec. During the step 630, room temperature DI water (approximately 20° C.) is dispensed at approximately 4.0 l/min onto the wafer along with the 50° C. to 80° C. modified SC-1 solution to reduce the temperature of the liquid on the wafer. This combination of spin rate and flow rate during step 630 may cover the entire topside of the wafer with the liquid solution. During the pH transition step 640, which lasts for approximately 15 seconds, the dispensing of the SC-1 solution is stopped and only DI water having a temperature of approximately 40° C. is dispensed onto the wafer. The 40° C. temperature of the distilled water may be accomplished by mixing 80° C. hot water and 20° C. cold water on the wafer. The combined flow rate of the 80° C. hot water and the 20° C. cold water may be approximately 4 l/min. The spin rate of the wafer is held constant at approximately 50 rpm during the pH transition step. This combination of spin rate and flow rate during step 640 may cover the entire topside of the wafer with the liquid solution. After the pH transition 640 the final rinse 650 of the wafer may occur. During the rinse 650, DI water having a temperature of approximately 40° C. is dispensed at a flow rate of approximately 3.5 l/min onto the wafer for approximately 20 seconds while the wafer is spinning at approximately 200 rpm. This combination of spin rate and flow rate during step 650 may cover the entire topside of the wafer with the DI water rinse. The 40° C. temperature of the DI water may be accomplished by mixing 80° C. hot water and 20° C. cold water on the wafer. This transition 620 from a modified SC-1 alkaline cleaning step to a DI water rinse may help prevent particle defects on the wafer by lowering the temperature of the liquid solution during the transition 620, by keeping the spin rate fairly low, and by slowly accelerating the spin rate to prevent agglomeration of the silica in the liquid solution.

According to another embodiment of the invention, an etchant additive may be added to the alkaline solution to enhance the etch rate of the solution at temperatures below approximately 50° C. while maintaining high particle removal efficiencies despite the low temperature of the alkaline solution. The etchant additives may promote the etching reaction by lowering the activation energy of the reaction or by increasing the activity of the reactants. The etchant additive may be the addition of more ammonia hydroxide to the alkaline solution. In one embodiment the ammonia concentration may be increased by approximately 4 times. For example, in the instance where a modified SC-1 alkaline solution is used the mixing ratio of AM-1/$H_2O_2$/$H_2O$ may be increased from approximately 1/2/80 to approximately 2/1/4. Although this method may put more species into solution during the pH transition, the increased number of species in solution may be offset by the use of the lower temperature during the pH transition.

In an alternate embodiment, an improved pH transition from the alkaline solution may be obtained by formulating the alkaline cleaning solution to contain fewer etchants to lower the etch rate so that fewer etched species and agglomerates are in the liquid solution during the pH transition. The etch rate may be lowered to within the approximate range of 0 angstroms/minute (Å/min) and 3 Å/min, and more particularly approximately 2 Å/min. In an embodiment, the amount of the etchant may be decreased in the alkaline solution in the approximate range of 3 times to 5 times less than the original concentration of the etchant, and more particularly, decreased by approximately 4 times less than the original concentration of the etchant. In one particular embodiment, the etchant may be ammonium hydroxide in the alkaline modified SC-1 solution having the original mixing ratio of 1/2/80 for $AM-1/H_2O_2/H_2O$. The amount of ammonia hydroxide within this solution may be reduced by reducing the amount of AM-1 within the mixing ratio within the approximate range of 3 to 5 times the amount in the original mixing ratio. In an alternate embodiment, the concentration of ammonia hydroxide may be decreased in the modified SC-1 solution by diluting the modified SC-1 solution with an alkaline solution having a lower ammonia hydroxide concentration sufficient to dilute the modified SC-1 solution. The alkaline solution having a lower ammonia hydroxide concentration may be added to the SC-1 solution either prior to or during the pH transition. The alkaline solution used to dilute the modified SC-1 solution may be another modified SC-1 solution.

In yet another embodiment, the wafer may be heated so that it has a temperature that is hotter with respect to the liquid on the surface of the wafer. Heating the wafer with respect to the liquid solution creates a thermophoretic force, repelling species away from the substrate surface. The wafer may be heated by dispensing a heated solution, such as water, on the backside of the wafer. Referring to FIG. 3, a heated solution 322 may be flowed under the wafer 100. The heated solution 322 may have a temperature in the approximate range of 70° C. and 100° C., and more particularly in the approximate range of 95° C. Therefore, the wafer 100 may be heated to a temperature in the approximate range of 20° C. and 90° C. hotter than the temperature of the liquid on the surface of the wafer, and more particularly in the approximate range of 50° C.

Several embodiments of the invention have thus been described. However, those ordinarily skilled in the art will recognize that the invention is not limited to the embodiments described, but can be practiced with modification and alteration within the spirit and scope of the appended claims that follow.

We claim:

1. A method comprising:
    applying a solution having first pH to the topside of a horizontally positioned spinning wafer to form a liquid layer, the wafer spinning at a first spin rate;
    minimizing the turbulence in the liquid layer during a transition in the liquid layer from the first pH to a second pH, the wafer spinning at a second spin rate during the transition, wherein minimizing turbulence within the liquid layer during the transition comprises keeping the second spin rate below 500 rpm;
    maintaining the second pH in the liquid layer while the wafer is spinning at a third spin rate.

2. The method of claim 1, wherein the first pH is in the approximate range of 9 and 10.

3. The method of claim 1, wherein the second pH is approximately 7.

4. The method of claim 1, wherein minimizing turbulence within the liquid layer during the transition comprises keeping the second spin rate below 200 rpm.

5. The method of claim 1, wherein minimizing turbulence within the liquid layer during the transition comprises keeping the second spin rate at approximately 50 rpm.

6. The method of claim 1, wherein the liquid layer has a thickness sufficient to prevent the deposition of particles onto the topside of the wafer.

7. The method of claim 6, wherein the thickness of the liquid layer is in the approximate range of 0.5 mm and 3.0 mm.

8. The method of claim 6, wherein the thickness of the liquid layer is approximately 1 mm.

9. The method of claim 1, further comprising heating the wafer to a temperature greater than that of the liquid layer.

10. The method of claim 9, wherein the wafer is heated to a temperature in the approximate range of 20° C. and 90° C. greater than the temperature of the wafer.

11. A method, comprising:
    dispensing a first liquid onto a wafer, the first liquid having a first temperature and a first pH;
    reducing the temperature of the first liquid so that the first liquid has a second temperature lower than the first temperature and a second pH that is substantially equal to the first pH; and
    replacing the first liquid at the second temperature and second pH with a second liquid, the second liquid having a third temperature substantially equal to the second temperature and a pH substantially lower than the second pH to prevent an agglomeration of a plurality of etched species.

12. The method of claim 11, wherein the first temperature of the first liquid is in the approximate range of 50° C. and 80° C.

13. The method of claim 11, wherein the second temperature is in the approximate range of 10° C. and 50° C.

14. The method of claim 11, wherein the second temperature is approximately 40° C.

15. The method of claim 11, wherein the first pH is in the approximate range of 9–10.

16. The method of claim 11, wherein the second pH is approximately 7.

17. The method of claim 11, wherein the first liquid is an alkaline solution and the second liquid is de-ionized water (DI water).

18. The method of claim 11, wherein reducing the temperature of the first liquid is done by introducing a third liquid into the first liquid, the third liquid having a fourth temperature that is significantly lower than the first temperature.

19. The method of claim 18, wherein the third liquid is DI water.

20. The method of claim 18, wherein the third liquid is an alkaline solution.

21. The method of claim 18, including introducing the third liquid into the first liquid prior to dispensing the mixture of the third and first liquids onto the wafer.

22. The method of claim 18, including introducing the third liquid into the first liquid on a surface of the wafer.

23. The method of claim 11, including spinning the wafer in a horizontal orientation.

24. The method of claim 11, wherein the first liquid has a concentration of etchant species, the method further comprising:

reducing the concentration of the etchant species in the first liquid prior to replacing the first liquid with the second liquid.

25. A method comprising:

dispensing a modified SC-1 cleaning solution having a temperature in the approximate range of 50° C. and 80° C. to a top surface of a horizontally spinning wafer having a first spin rate of approximately 8 rpm for approximately 25 seconds;

increasing the first spin rate to a second spin rate of approximately 50 rpm at a rate of approximately 5 rpm/second while dispensing a first solution of deionized water having an approximate temperature of 20° C. onto the top surface of the wafer; and stopping the dispensing of the modified SC-1 cleaning solution but maintaining the dispensing of the first solution of deionized water while dispensing a second solution of deionized water having a temperature of approximately 80° C. for 15 seconds at the second spin rate.

26. The method of claim 25, further comprising increasing the second spin rate to a third spin rate of 200 rpm for 20 seconds while continuing to dispense the first solution of deionized water and the second solution of deionized water.

27. The method of claim 25, wherein the modified SC-1 solution is dispensed at a flow rate of approximately 4.0 l/mm.

28. The method of claim 25, wherein the first deionized solution and the second deionized solution combined are dispensed at a flow rate of approximately 4.0 l/min.

29. A method comprising:

applying a solution having first pH to the topside of a horizontally positioned spinning wafer to form a liquid layer, the wafer spinning at a first spin rate;

minimizing the turbulence in the liquid layer during a transition in the liquid layer from the first pH to a second pH, the wafer spinning at a second spin rate during the transition, wherein minimizing turbulence within the liquid layer during the transition comprises changing the first spin rate to the second spin rate at a rate of less than 100 rpm/second;

maintaining the second pH in the liquid layer while the wafer is spinning at a third spin rate.

30. The method of claim 29, wherein minimizing turbulence within the liquid layer during the transition comprises changing the first spin rate to the second spin rate at a rate of less than 50 rpm/second.

31. The method of claim 29, wherein minimizing turbulence within the liquid layer during the transition comprises changing the first spin rate to the second spin rate at a rate of approximately 5 rpm/second.

* * * * *